(12) United States Patent
Yao et al.

(10) Patent No.: US 12,396,091 B2
(45) Date of Patent: Aug. 19, 2025

(54) COMPONENT CARRIER WITH A VIA CONTAINING A HARDENED FILLING MATERIAL

(71) Applicant: AT&S Austria Technologie & Systemtechnik Aktiengesellschaft, Leoben (AT)

(72) Inventors: Shuying Yao, Leoben (AT); Abderrazzaq Ifis, Leoben (AT); Jens Riedler, Trofaiach (AT); Vanesa López Blanco, Vimianzo (ES)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 267 days.

(21) Appl. No.: 18/053,716

(22) Filed: Nov. 8, 2022

(65) Prior Publication Data

US 2023/0156912 A1    May 18, 2023

(30) Foreign Application Priority Data

Nov. 15, 2021  (EP) ..................... 21208253

(51) Int. Cl.
  *H05K 1/02* (2006.01)
  *H05K 1/11* (2006.01)
  *H05K 3/06* (2006.01)

(52) U.S. Cl.
  CPC .......... *H05K 1/0296* (2013.01); *H05K 1/115* (2013.01); *H05K 3/06* (2013.01); *H05K 2201/068* (2013.01); *H05K 2201/09545* (2013.01)

(58) Field of Classification Search
  CPC ........ H05K 1/0296; H05K 1/115; H05K 1/02; H05K 1/11; H05K 2201/068;
  (Continued)

(56) References Cited

U.S. PATENT DOCUMENTS 5,259,767 A * 11/1993 Kurbikoff .............. H01R 12/57
                                                439/59
6,015,520 A *  1/2000 Appelt .................. B29C 61/006
                                                264/273

(Continued)

FOREIGN PATENT DOCUMENTS

CN   106893101 A  *  6/2017  ............. C08G 73/12
JP   2002176247 A  *  6/2002  ............... H05K 3/00
(Continued)

OTHER PUBLICATIONS

Tour of the EMS 3rd edition v7_NASA_pp. 1-32_2016.*
(Continued)

*Primary Examiner* — Timothy J Thompson
*Assistant Examiner* — Guillermo J Egoavil
(74) *Attorney, Agent, or Firm* — Robert A. Blaha; Smith Tempel Blaha LLC

(57) ABSTRACT

A component carrier having a stack with at least one electrically conductive layer structure and at least one electrically insulating layer structure; an opening located at least partially in the stack; and a fill material which is located within the opening. The fill material is a photosensitive material, wherein at least a part of the photosensitive material has undergone a hardening treatment with electromagnetic radiation. A method for manufacturing such a component carrier is further described.

20 Claims, 3 Drawing Sheets

(58) Field of Classification Search
CPC . H05K 2201/09545; H05K 2201/0959; H05K 3/0094; H05K 3/06; H05K 3/42
USPC .......................................................... 174/262
See application file for complete search history.

(56) References Cited

U.S. PATENT DOCUMENTS

| | | | |
|---|---|---|---|
| 6,426,298 B1 | 7/2002 | Chen et al. | |
| 2002/0100608 A1* | 8/2002 | Fushie | H05K 3/388 257/E23.174 |
| 2003/0188890 A1 | 10/2003 | Bhatt et al. | |
| 2007/0130761 A1 | 6/2007 | Kang et al. | |
| 2009/0246441 A1* | 10/2009 | Chan | C09D 11/037 428/688 |
| 2010/0044095 A1* | 2/2010 | Kuczynski | H05K 1/115 174/266 |
| 2015/0235955 A1* | 8/2015 | Kudo | H01L 21/02071 438/623 |
| 2017/0373049 A1* | 12/2017 | Fischer | H01L 25/167 |
| 2018/0253005 A1* | 9/2018 | Huang | G03F 7/0047 |
| 2020/0119036 A1* | 4/2020 | King | H10B 43/35 |
| 2022/0305818 A1* | 9/2022 | Hoover | B41J 11/007 |

FOREIGN PATENT DOCUMENTS

| | | | | |
|---|---|---|---|---|
| KR | 20000041059 A | * | 7/2000 | ............. H05K 3/429 |
| KR | 100688702 B1 | | 3/2007 | |
| KR | 20090066781 A | * | 6/2009 | ........... H05K 1/0216 |

OTHER PUBLICATIONS

Thermal Expansion of Solids and Liquids _ Physics_pp. 2-20_Apr. 2021.*

Doethals, F.; Extended European Search Report in Application No. 21208253.1; pp. 1-10; Apr. 29, 2022; European Patent Office, 80298, Munich, Germany.

* cited by examiner

COMPONENT CARRIER WITH A VIA CONTAINING A HARDENED FILLING MATERIAL

CROSS-REFERENCE TO RELATED APPLICATIONS

This application claims the benefit of the filing date of European Patent Application No. 21208253.1, filed on Nov. 15, 2021, the disclosure of which is hereby incorporated herein by reference.

TECHNICAL FIELD

Embodiments disclosed herein relate to component carriers used as a support structure for (i) building up electronic assemblies, e.g., electronic circuits comprising at least one active or passive electronic component or (ii) substrates for carrying integrated (semiconductor) circuit chips. Further, the present technology relates to a method for manufacturing such a component carrier.

BACKGROUND ART

Component carriers or Printed Circuit Boards (PCB) are regularly used as a structural support for building up electronic assemblies comprising one or more electronic components being electrically connected with each other in such a manner that an electrically operational assembly is formed. Therefore, a component carrier comprises conductor paths on its top or bottom surface in order to provide the necessary electric wiring between the electronic components. In a so-called Multilayer PCB even conductor paths are formed in the interior of the PCB in between different neighboring electrically insulating PCB layer structures.

Conductor paths within a (horizontal) plane are typically realized by means of an appropriately patterned electrically conductive layer structure which is arranged on an electrically insulating layer structure or between two (vertically neighboring) electrically insulating layer structures. For electrically connecting different (patterned) electrically conductive layer structures vertical interconnects, which are typically realized with metallized vias, are used.

A via can be filled completely with a conductive material. Alternatively, only the sidewalls of the via can be plated with conductive material. In the latter case, conductive material such as copper can be saved. However, there is the risk that unwanted particles enter the inner region of the via. This may have a detrimental influence on the electrical behavior of the respective vertical interconnection. Further, material from further processing steps with which an additional build-up layer is added may enter the interior of the via. Hence, the interior of a via often is intentionally closed during and/or at the end of manufacturing a multilayer component carrier. An intentional via filling process is also called a plug-in process.

Known plug-in processes use a screen-printing procedure in order to transfer a filling material into a via. However, screen printing is a process which is difficult to control. One problem with screen printing is that its spatial resolution is comparatively low and the resulting upper screen-printed surface is not very even or flat which is of course detrimental in particular when a further build-up layer should be formed on top of the "screen printed surface". Hence, in particular due to the low spatial resolution it is typically necessary to remove residues of excessive filling material from the surface of the respective panel. If these residues are not removed they could lead to an unwanted material/ion migration. Hence, with known processes it is necessary to grind a surface which has been subjected to a screen-printing procedure in order to allow a further processing.

However, a plug in and subsequent grinding process is time-consuming and challenging to control because it can easily (i) lead to critical defects such as copper voids and paste residues (which are prone to migrate during operation of the component carrier) and (ii) influence potential further process steps such as plating, photo imaging, etc. These challenges become bigger because the required integration densities of electronic assemblies permanently increase.

SUMMARY

There may be a need for closing open vias of a component carrier in an effective and precise manner in order to allow for an easy further processing.

This need may be met by the subject matter according to the independent claims. Advantageous embodiments of the present invention are described by the dependent claims.

According to a first aspect there is provided a component carrier comprising (a) a stack comprising at least one electrically conductive layer structure and at least one electrically insulating layer structure; (b) an opening located at least partially in the stack; and (c) a fill material (or fill medium) which is located within the opening, wherein the fill material is a photosensitive material, wherein at least a part of the photosensitive material has undergone a hardening treatment with electromagnetic radiation.

A method for manufacturing a component carrier includes providing a stack comprising at least one electrically conductive layer structure and at least one electrically insulating layer structure; forming at least one opening located at least partially in the stack; applying a photosensitive material at a main surface of the stack such that the opening is filled at least partially with the photosensitive material; treating at least some regions of the applied photosensitive material such that the photosensitive material is hardened; and removing excessive hardened material such that surface portions of the main surface of the stack outside from the at least one opening are free from hardened material.

Overview of Embodiments

The described component carrier is based on the idea that by contrast to known plug in procedures using the photosensitive fill material allows to remove excessive fill material in an easy and effective manner which excessive fill material has been deposited outside from the opening on or at an outer surface plane of the component carrier when applying the fill material onto this surface in order to transfer or "press" it into the (at least one) opening, e.g., a cavity or a via to be plugged.

For removing excessive fill material known developing procedures, which include an exposure with electromagnetic radiation and a subsequent stripping of the exposed fill material (e.g., by means of dissolving it) can be used. With such a procedure in particular the excessive material outside from the (at least one) opening can be removed. However, it is pointed out that also excessive fill material in the region of the (at least one) opening, which excessive fill material protrudes from the outer surface plane, can be removed when "dosing" the chemical etching procedure in an appropriate manner.

The described fill material may be for instance a so-called photoresist material. Such a material is widely used in the electronic industry to pattern a metallic/copper layer in order to form electric conductor traces.

At this point it should be mentioned that known via plugging procedures are typically realized with a printing process employing a stencil or a mask which is used for preventing excessive material outside from the (at least one) via, such a known masking approach is never perfect. Reasons for the deficiency of any masking process are e.g. (a) a misalignment of the mask with respect to the (at least one) via, (b) a pattern of diaphragm openings in the mask, which pattern does not perfectly match to the pattern of the vias, (c) diaphragm openings having a diameter which is larger than the diameter of the (at least one) via to be plugged, (d) leakiness between the lower surface of the mask and the outer (upper) surface of the component carrier. As a consequence, known plug in procedures require a grinding step after the printing process because unwanted residues are prone to mitigate during operations.

The manufacturing of the component carrier described in this document does not require such a grinding process because excessive photosensitive filling material can be removed with non-mechanical surface smoothing processes. Hence, the component carrier can not only be manufactured in an effective and precise manner, but the component carrier can also further exhibit a surface roughness which is much smaller than a surface roughness which can be realized with mechanical grinding. Hence, a further processing of the component carrier, which may include, e.g., forming at least one additional build up layer, can be realized in a reliable and precise manner. Further, due to omitting a mechanical grinding, a cost reduction can be achieved which may result in an additional yield gain and an increased product capability. Furthermore, when manufacturing such a component carrier the production yield may be increased by omitting the grinding step.

Further, the described component carrier, which can be manufactured without the need of a grinding procedure, can avoid the following disadvantages (1) and (2) being associated with a grinding process.

(1) A grinding procedure indirectly impacts the achievable line/space ratio of copper traces formed on the stack (of the component carrier or on the component carrier). Fill material residues remaining after the grinding may further lead to a material migration (during operation) which can render the manufactured component carrier nonstable.

(2) In a grinding procedure it is not possible to completely avoid also a removal of the material of an upper metal (in particular copper) layer, which, when being structured or patterned, forms electric conductor traces. Hence, the grinding procedure thereby creates a copper thickness distribution of up to 15 μm difference in comparison to the initial copper thickness. As a consequence, the electric impedance and with that the performance (as well as the reliability) of the whole component carrier suffers in particular for High Frequency (HF) applications. By contrast thereto, the described component carrier allows to be manufactured with a very small or sharp copper thickness distribution, which more or less is the same before inserting the fill material and after removing unwanted residues of the fill material (in a non-mechanical manner). Hence, in the described component carrier the overall surface roughness may be below 5 μm. Thereby, the surface roughness may be directly related to the previously applied copper. The (average) total thickness of the applied copper may depend on the technique used for applying the copper. When using a prefabricated copper foil, the surface roughness may be even smaller than 5 μm or even smaller than 3 μm.

According to an embodiment the fill material comprises (a cured) ink.

In the context of this document the term "ink" may refer to any material with is applicable by a printing process and which is capable of being inserted into an opening/via in order to provide the desired plug-in effect. Specifically, the term "ink" used in this document may refer to a liquid substance with a photosensitive functionality used in order to ensure a pattern transfer in a component carrier or PCB. Viscosity, plasticity and thixotropy and chemical resistance are among the most important criteria for ink selection depending on the respective application and/or the employed process steps. A photosensitive ink can be for instance a solder resist, a photoresist, a (thin) film, a polymer, or any resin capable to harden. Optionally, the ink can be functionalized either by adding fillers (such as conductive or magnetic particles) and additives or by chemically functionalizing the chemical components. For instance, covalently bound functional groups may increase, e.g., the polarity and/or wettability of the ink.

Ink in the context of this application can be applied by screen printing, by ink-jet printing, by dispensing it, by spraying and/or any other suitable coating technique. The deposition of ink can be supported by a negative pressure (vacuum). This may allow to fully fill the openings without any voids, cracks, or bubbles, even when the ink comprises a comparatively large viscosity.

Using ink as the fill material may provide the advantage that it can be processed with different degrees of viscosity. Hence, depending on the specific application a suitable ink with an appropriate solvent content can be used. As mentioned above, a negative pressure may support an ink deposition in particular for ink with a high viscosity.

Further, for via plugging, ink exhibits a plurality of advantageous properties which will be described in the following. These advantageous properties can be subdivided into (A) chemical stability, (B) dimensional/thermal stability, (C) paste properties or functionalization, (D) color properties.

(A) Chemical Stability

Ink is generally stable against main chemicals after curing. Hence, after curing, desmearing acids and/or other PCB processing chemicals will not affect the deposited cured ink. Further, cured ink is suitable for being seeded with copper allowing for a later formation of an electrically conductive copper layer on the cured ink material, e.g., by means of effective and per se known electroplating processes. Further, by contrast to known screen printing procedures a photosensitive ink can be applied and/or cured with no blisters, bubbles, or cracks. Further, ink comprises no or only a very small unwanted water/humidity absorption capability. Further, ink comprises no or only a neglectable unwanted interaction with PCB finish materials, such as, e.g., Organic Solderability Preservative (OSP) or Electroless Nickel Immersion Gold (ENIG). Further, ink can be embodied as a photo positive or alternatively as a photo negative material. Hence, depending on the specific manufacturing conditions an appropriate photosensitive ink can be selected.

(B) Dimensional and Thermal Stability

Ink material has typically a Coefficient of Thermal Expansion (CTE) which fits to the CTE of most materials being used for manufacturing component carriers. Further, ink typically exhibits a small shrinkage. Furthermore, ink can withstand many (e.g., seven) process cycles which may be for instance heat and/or pressure assisted lamination processes in order to form additional build up layers on top and/or at the bottom of the described component carrier. This withstanding of several process cycles may even be possible at a high decomposition temperature of, e.g., more than 250° C. Further, some ink materials are electrically conductive which may allow to convert metallized vias, which have a metallization only at the sidewalls, into "fully conductive" vias.

(C) Paste Properties/Functionalization

As has already been briefly mentioned above, ink can be provided with a suitable viscosity which is generally large in order to enable a high-quality printing process but which is sufficiently small such that the ink can be transferred in a void free manner into the (at least one) via. Further, ink is available with different thixotropic indices which allows for achieving a high printing performance. Ink can be provided with filler particles with small particle sizes. Further, ink may be treatable with plasma which may allow to easily remove excessive cured ink from the treated surface of the component carrier.

Depending on the specific application the function, respective of the physical and/or chemical behavior of the ink may be adapted in a suitable manner. Specifically, with appropriate measures such as by adding functional fillers or by tuning the chemistry of the resin (including additives or introducing functional groups) an ink functionality may be modified or a new functionality may be added to the ink. Examples for a functionalization change may be an increase of adhesion, a coloration or adding/changing magnetic properties. This may provide the advantage that ink may allow to engineer the mechanical properties in terms of elastic modulus and CTE mismatches. This can be done by working with ink being reinforced with particles.

(D) Color Properties

Ink can be provided in different colors. Hence, an appropriate ink color can be selected in order to ensure a high detectability with known Automatic Optical Inspection (AOI) machines. This facilitates a quality inspection of the described component carrier in particular before carrying out further processing steps.

According to a further embodiment the fill material comprises (a cured or hardened) resin. A curable resin material is typically known for forming an electric insulating or dielectric layer of a component carrier. Hence, handling and processing such a material will be easy for manufacturing the described component carrier.

According to a further embodiment the fill material comprises functional particles. This may provide the advantage that the plug-in process does not only result in a mechanical plugging but also allows to provide the interior of the opening with a functionality which can be in particular of a non-mechanical nature. A non-mechanical property may be for instance (a) a thermal conductivity, e.g., for transferring heat away from an operating electronic component, (b) an electric conductivity, e.g., for reducing the resistance of a via interconnection compared to a solely sidewall plated via, and/or (c) a magnetizability, e.g., for magnetic shielding purposes.

It is mentioned that the size of the functional particles should be selected such that a possibly increased viscosity does not deteriorate the capability of the fill material to be inserted into the interior of the opening.

According to a further embodiment the fill material comprises a first Coefficient of Thermal Expansion (CTE) being smaller than a second CTE of the electrically insulating layer structure. Preferably, a CTE difference between the first CTE and the second CTE is larger than 2 ppm/K, in particular larger than 4 ppm/K. This may provide the advantage that unwanted warpage effect in particular at varying temperature conditions can be reduced.

In other words, (also) the mechanical properties of the component carrier can be adapted/changed with appropriate CTE values for the electrically insulating layer structure and the fill material. Thereby, the CTE values should be selected in order to achieve a smaller CTE mismatch.

The mentioned adaptation of the CTE behavior resulting in reduced warpage can be realized with any appropriate type and any appropriate amount of functional particles. Specifically, a CTE mismatch can be reduced in order to reduce an unwanted warpage of the component carrier.

It is mentioned that a warpage reduction can alternatively or in combination also be achieved by choosing a proper young-modulus of the fill material. It is also possible that different openings are filled with different filling materials to even better tune the mechanical properties and to consequently counter unwanted warpage effects. Also, adapting the glass transition temperature of the filling material may be a measure to reduce warpage (already during the manufacturing process of the described component carrier).

According to a further embodiment the component carrier further comprises (a) at least one further opening, which, together with the opening, defines a plurality of openings; and (b) a further fill material. Thereby, at least one opening of the plurality of openings is filled with the further fill material.

Provided that the fill material and the further fill material have at least one different property (e.g., a mechanical property such as CTE value and/or Young modulus), different openings exhibit different properties which can be exploited in order to tune the functional and/or mechanical properties of the stack. thereby, openings filled with the fill material may define a first subregion of the stack and other openings with the further fill material may define a second subregion of the stack. It is mentioned that such a spatial differentiation of the stack respectively of the component carrier requires a local application of fill material which means that the fill material has to be selectively applied in the first subregion and the further fill material has to be applied selectively in the second subregion. Such an approach is especially suitable when manufacturing asymmetric build ups, which are prone to undergo warpage. By compensating the CTE mismatch of different subregion's unwanted warpage can be avoided.

In some embodiments the component carrier comprises (a) a first subregion with at least one first opening, wherein the fill material occupies the at least one first opening up to a first filling height and (b) a second subregion with at least one second opening, wherein the fill material (or the further fill material) occupies the at least one second opening up to a second filling height, wherein the second filling height is different from the first filling height. In this context the term filling height refers to a position along a vertical z-axis which is oriented perpendicular to the main surfaces of the stack.

The described spatial differentiation with regard to filling heights may be employed in order to realize spatially different functional regions of the component carrier in a simple and effective manner. For instance, there may be provided (a) a first functional region for supplying electric power to at least one (high power) electric component mounted to and/or embedded within the component carrier and (ii) a second functional region for transferring and/or transmitting High Frequency (HF) signals within the component carrier and/or to and/or from external HF circuitry.

According to a further embodiment the fill material is optically transparent. This may provide the advantage that an optical inspection of an intermediate product of the described component carrier can identify unwanted defects in the (hardened) fill material which defects deteriorate the quality not only of this intermediate product but also of the final product, i.e., the described component carrier. Hence, low quality or defective intermediate products can be eliminated from a large-scale component carrier process such that all produced final product component carriers are high quality end products.

Potential defects within the optically transparent fill material, which can be identified with a usual Automated Optical Inspection (AOI) in a reliable manner, are e.g. (entrapped) air bubbles. The higher the transparency of the fill material the more reliable may be the AOI with regard to such kind of defects.

In this context it is mentioned that in other embodiments the fill material is colored. A colored fill material may provide the advantage that an AOI of surface defects if the fill material (in the region of the at least one opening) may be facilitated.

According to a further embodiment the opening comprises sidewalls which are coated at least partially with an electrically conductive material. In case of a via opening this may provide the advantage that the plugged via can still provide the usual function of a via, namely, to provide an electric vertical interconnection between different (patterned) electrically conductive layer structures of the stack. Further, in the presence of the described sidewall coating there will be no direct mechanical contact between the fill material and the dielectric material of electrically insulating layer(s) of the stack. Hence, when inserting the fill material into the via the two materials (i) fill material and (ii) dielectric material will not come into direct physical contact. Hence, these materials will not interact with each other. This holds true for any state, e.g., uncured, partially cured and fully cured.

The conductive material may be a metal, in particular copper (Cu). The conductive material can be applied with per se know measures such as plating, in particular electroplating.

According to a further embodiment the opening is a through hole via or a blind hole via. This may provide the advantage that the described plugging can be realized also with vias which are widely used in many different types of component carriers.

In particular, in a multilayer component carrier having several patterned electrically conductive layer structures the (through hole or blind hole) via may have at least partially metallized sidewalls. Such a metallized via is called a plated via. Depending on the circuitry design of such a multilayer component carrier a plated via may be electrically connected with a pad being formed as a part of such a patterned electrically conductive layer structure.

According to a further embodiment a first portion of the via is filled with the fill material and a second portion of the via is an open portion. Preferably, only the open portion of the via comprises metallized sidewalls. Such a spatial segmentation of the via may be of advantage for instance for embodiments where only a part of the via, here the second portion, is used for a propagation of HF signals and the other part of (the same) via, here the first portion, is used for another purpose such as for instance for adapting the functional and/or mechanical properties of the stack (as described above) e.g. by means of functional particles. Specifically, not filling the second portion with the fill material may result in a better HF behavior because of a minimization of dielectric material within the electric path of the HF signals which dielectric material, due to its dielectric constant, attenuates the HF signals.

It is pointed out that such a partial sidewall metallization can be realized for instance by (a) first plating the entire sidewall of the via and (b) drilling back into the via such that the metallized plating (within the second portion) is removed. In order to insert the fill material exclusively within the first portion the viscosity of the fill material can be adapted appropriately, e.g., by means of the above-described functional particles.

According to a further embodiment the electrically conductive layer structure comprises (a) a smooth surface roughness of less than 10 μm, preferably less than 5 μm and/or (b) a thickness variation of less than 10 μm, preferably less than 5 μm. This may provide the advantage that conductor traces formed from patterning the electrically conductive layer structure exhibit small impedances and/or small spatial impedance variations. Alternatively or in combination, such conductor traces may exhibit a small electric resistance and/or small spatial resistance variations.

It is mentioned that the described beneficial small roughness and/or thickness variation may be the direct result of the above-described matter of fact that no grinding procedure is needed. Further, avoiding grinding may result in a uniform grain size distribution along the (main) surface of the component carrier. This means that the crystalline structure of the electrically conductive layer structures at its (main) surface is the same or is at least very similar to the crystalline structure in the interior of the electrically conductive layer structures.

According to a further aspect there is provided a method for manufacturing a component carrier. The component carrier may be a component carrier as described above. The provided method comprises (a) providing a stack comprising at least one electrically conductive layer structure and at least one electrically insulating layer structure; (b) forming at least one opening located at least partially in the stack; (c) applying a photosensitive material at a main surface of the stack such that the opening is filled at least partially with the photosensitive material; (d) treating at least some regions of the applied curable material such that the photosensitive material is hardened at least partially; and (e) removing excessive hardened material such that surface portions of the main surface of the stack outside from the at least one opening are free from hardened material.

The described method is based on the idea that a closure of opening(s), e.g., a so called via plugging, can be accomplished with a not hardened/an uncured photosensitive fill material which after having been inserted into the interior of the opening is hardened respectively cured. Compared to known plugging methods unwanted excessive fill material deposited at the treated outer surface of the component carrier or the stack can be removed easily in such a manner that a mechanical grinding procedure is not necessary.

Specifically, with the described method the step of removing the excessive hardened material is carried out with a non-mechanical treatment.

Avoiding a mechanical "post treatment" may provide the advantage that selected small openings such as vias being arranged with a high spatial density can be plugged. This may allow to further increase the integration density of electronic assemblies. Further, the impedance of component carriers and/or the signal quality of signals propagating through the component carrier can be improved with such highly integrated electronic assemblies.

For applying the photosensitive material any suitable coating process can be used. This includes coating processes which are carried out along or over the entire main surface.

For treating the applied photosensitive material any known developing process can be used. Specifically, an appropriate developing process may be based on electromagnetic radiation (e.g., in the UV spectral range). Further, laser radiation can be used by carrying out, e.g., a so-called Laser Direct Imaging (LDI) process. Of course, also other developing methods can be used, such as structuring the electromagnetic radiation by means of a mask.

For the sake of clarity it is pointed out that the cured material within the at least one via will not be removed or will at least not be removed completely. Thereby, the amount of cured material within the via will be sufficient such that a reliable via plugging can be guaranteed.

According to an embodiment removing excessive hardened material comprises an etching procedure, in particular a wet or chemical etching procedure. Alternatively or in combination, a dry or plasma etching procedure can be used. The selection of a wet or a dry etching procedure may depend on the specific application. In some applications the dry etching procedure may be realized with a so-called reactive ion etching.

The described etching procedure may be a so called "developing procedure" which is per se widely known from PCB manufacturing and in particular from patterning at least one metallic layer of a PCB. This may provide the advantage that the described method can be realized with well-established and approved procedures.

In this context a "developing procedure" may be any process, wherein, e.g., a resin material, which has not been previously exposed/cured by electromagnetic radiation (e.g., UV light), will be removed. This can be done by etching but in PCB manufacturing this is done by a so-called stripping process. The stripping process uses chemicals capable of swelling and/or decomposing uncured resin. Thus, after developing, only the hardened resin, previously exposed to electromagnetic radiation, will stay onto the respective surface.

In some applications also a (small) portion of the hardened (fill) material within the opening will be removed. In this case of via openings a sufficient via plugging can be guaranteed by "dosing" the etching procedure in an appropriate matter. Specifically, the etching procedure should be sufficiently "strong" such that the excessive hardened material will be removed completely, and the etching procedure should be not so strong that a significant amount of hardened material is removed from the (inside of the) via.

According to a further embodiment treating at least some regions of the applied photosensitive material comprises treating selectively predefined regions of the applied photosensitive material such that some regions of the applied photosensitive material become hardened regions and other regions of the applied photosensitive material remain unhardened regions. This may provide the advantage that the hardening can be spatially restricted to those regions of the main surface which, with the described "removing step", should be either removed or should withstand the "removing step". Thereby, the type of the photosensitive material determines whether the treated material portions are removed from the main surface or remain at the main surface of the stack.

In some embodiments the photosensitive material is a photoresist material. This may provide the advantage that with the help of a spatially structured radiation the photosensitive material can be cured respectively hardened in such a manner that only the predefined regions become hardened. Hence, all other regions on the main surface remain uncured.

When using a photoresist material (and/or a so called "photo imageable ink" as described below) to coat the main surface and to fill at least partially the interior of the at least one opening an electromagnetic radiation with a proper wavelength can be used in order to cure/harden the photosensitive material in a spatially patterned manner. The electromagnetic radiation being directed to the main surface may be (focused) laser radiation which can be directed solely and selectively (e.g., by means of a laser scan such as Laser Direct Imaging (LDI)) to the predefined regions. Alternatively or in combination, an appropriate mask can be employed in order to selectively block those radiation paths which should not reach the main surface of the stack.

The described "photo imaging" of the photosensitive material as well as the use of an exposure and developing process to develop away the "inactivated" photosensitive material allows to realize a smooth surface of the photosensitive material and to remove excessive "plugging material" without a grinding process. Therefore, a particular high yield for plug in design PCBs can be achieved.

In some embodiments the photosensitive material is an ink material. This may provide the advantage that the photosensitive material can be applied to the main surface of the stack in an easy and reliable manner. There is no need for carrying out a complicated process step for the sole purpose of applying the photosensitive material.

According to a further embodiment the photosensitive material is applied by means of (i) a screen-printing process and/or (ii) an ink jet printing process. The printing process may also be a 3D printing process. Alternatively, any dispensing method can be used to locally apply the photosensitive material respective of the ink. Moreover, the filling process can be vacuum supported, especially if the viscosity of the photosensitive material/ink increases or if the photosensitive material/ink comprises functional particles.

It is pointed out that also other coating techniques are possible, such as simply spraying the ink onto the surface.

Employing a screen-printing process may provide the advantage that the photosensitive material can be applied at the entire main surface to stack (of course in a spatially patterned manner) within one process step which per se is known in the field of PCB manufacturing. Specifically, the described screen printing of the photosensitive material may be similar to a process with which solder paste is selectively applied to predefined contact pads on the main surface of the stack/PCB. Of course, the concrete printing parameters will have to be adapted to the physical consistency of the photosensitive material, in particular the viscosity.

Employing an ink jet printing process may provide the advantage that the photosensitive material can be selectively applied only to those surface portions which should be provided with the photosensitive material. Hence, the amount of excessive photosensitive material can be reduced.

This may have the advantage that the amount of waste of photosensitive material can be reduced.

According to a further embodiment the photosensitive material is a positive photosensitive material or alternatively a negative photosensitive material. This means that the described method can be carried out with different types of curable materials. Hence, depending on the specific application a suitable photosensitive material can be used as the curable material.

In case of a positive photosensitive material portions being exposed to electromagnetic radiation undergo a cross linking of polymer chains which result in a hardening respectively a curing. A suitable positive (liquid) photosensitive material may be for instance the material PSR-4000 PF9HF3 available from the company Taiyo America Inc.

In case of a negative photosensitive material exposing material portions to electromagnetic radiation results in a decomposition or a rearrangement of molecules within these material portions. These effects may result in an increased solubility in aqueous solutions for instance because of the generation of polar molecules.

According to a further embodiment the method further comprises, after removing excessive hardened material, performing a plasma treatment procedure.

The described plasma treatment, which may be carried out in particular at the main surface of the stack, may be used in order to increase the roughness of the main surface. This may increase the so-called surface energy which results in a better adherence of copper which may be formed on the roughened surface by means of any suitable procedure such as sputtering (e.g., for forming a so-called seed layer). A known plating and in particular an electroplating process may follow after such a sputtering process. Hence, not only the sputtered but also the (electro)plated copper will adhere in a durable manner. As a beneficial consequence, unwanted cracks or voids can be avoided.

It is pointed out that the described plasma etching may be applied over the entire main surface. However, in some preferred embodiments, the plasma etching is applied only locally.

The described plasma treatment can be also used in combination with the above described (dry) plasma etching procedure for removing the excessive hardened material. Specifically, plasma from a first plasma chamber may be used for the excessive material removal. Plasma from a second plasma chamber may be used for an adhesion promotion. Plasma from a third chamber may be used to sputter a seed-layer.

According to a further embodiment (a) applying the photosensitive material (130) at the main surface is carried out in such a manner that further a (thin two dimensional) metal layer defining the main surface is coated (in two dimensions) with the photosensitive material and (b) treating at least some regions of the applied photosensitive material is carried out in such a manner that further the photosensitive material coating the (thin two dimensional) metal layer is spatially structured. This may provide the advantage that the thus structured layer of photosensitive material can be used for further processing the component carrier respectively the stack such that the (thin two dimensional) metal layer is patterned in order to form a structured layer with predefined conductor traces. The metal layer may be, in particular, a copper layer.

The metal layer patterning can be realized for instance by means of an etching procedure, wherein metal material being located in recessed regions of the spatially structured photosensitive material is removed. Alternatively, the metal layer patterning may be realized with a Semi Additive Process (SAP), which is also called a modified SAP (mSAP) process. In mSAP the recessed regions of the thin metal layer are provided with further metal material for instance by means of electroplating until a desired copper thickness is achieved. In next steps of mSAP, the spatially structured photosensitive material is removed and the uncovered (initial) thin metal material portions are removed by means of a so called differential etching. Thereby, also minor metal material is removed from the previously provided further metal material.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless otherwise noted, in addition to any combination of features belonging to one type of subject matter also any combination between features relating to different subject matters, in particular between features of the method type claims and features of the apparatus type claims is considered as to be disclosed with this document.

The aspects defined above and further aspects of the present technology are apparent from the examples of embodiment to be described hereinafter and are explained with reference to the examples of embodiment. The invention will be described in more detail hereinafter with reference to examples of embodiment but to which the invention is not limited.

Before, referring to the drawings, exemplary embodiments will be described in further detail, some basic considerations will be summarized based on which exemplary embodiments of the invention have been developed.

In the context of this document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of this document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of this document, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

An embedded component may be an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold), etc.

DETAILED DESCRIPTION OF ILLUSTRATED EMBODIMENTS

Figure 1A:
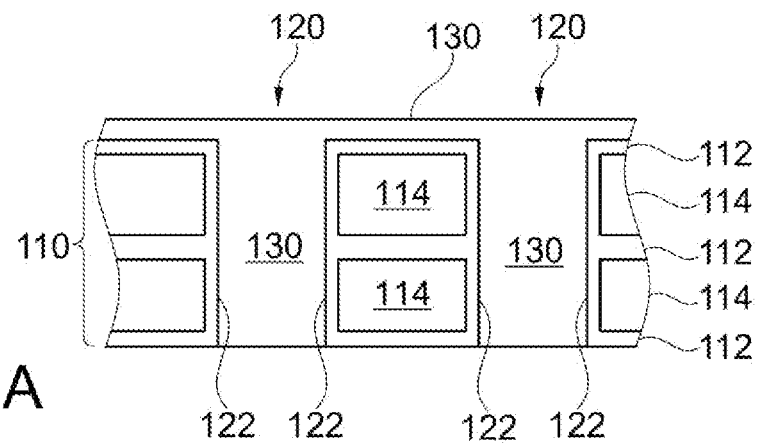
FIG. 1A, FIG. 1B, FIG. 1C, and FIG. 1D illustrate a process workflow wherein vias of a component carrier are plugged with a positive photosensitive ink.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

FIGS. 1A to 1D illustrate a process workflow for manufacturing a component carrier 100 in accordance with an embodiment described in this document. For the sake of clarity of illustration in these Figures (and also in the following FIGS. 2A to 2D and 3A to 3C) only a portion of the component carrier 100 is depicted. This exemplary portion comprises two vias 120.

As can be taken from FIG. 1A, there is provided a stack 110. Such a stack 110 is known from usual PCB manufacturing. Specifically, the stack 110 comprises three electrically conductive layer structures 112 and two electrically insulating layer structures 114. Respectively one electrically insulating layer structure 114 is sandwiched between two electrically conductive layer structures 112. According to the exemplary embodiment described here the electrically conductive material of the electrically conductive layer structures 112 is copper. The material of the electrically insulating layer structures 114 is a usual resin sheet or prepreg material.

Within the stack 110 the openings shapes as vias 120 are formed. The vias 120 comprise sidewalls 122, which are coated with an electrically conductive material. According to the exemplary embodiment described here also this electrically conductive material is copper. Further, according to the embodiment described here the vias 120 are through hole vias. In other non-depicted embodiments at least one of the vias is a blind hole via, which is closed for instance by a continuous extension of at least one (but not of all) of the electrically conductive layer structures 112 and the electrically insulating layer structures 114. Depending on the specific application, the vias 120 may be fully plated, partially plated or not plated (sidewalls are free from plating).

On an upper main surface of the stack 110 there has been applied a curable/photosensitive material 130. This can be done for instance by means of a (screen) printing process. As can be taken from the drawing, this photosensitive material 130 is not only applied at the main surface of the stack 110. The photosensitive material 130 has also entered the interior regions of the vias 120. In the embodiment illustrated here the vias 120 are completely filled or plugged with this photosensitive material 130. Hence, in this document the photosensitive material is also denominated as "fill material". In other not depicted embodiments the photosensitive material 130 has penetrated only partially into the interior of the vias 120. However, the amount of penetrated photosensitive material 130 should be enough in order to realize a plugging.

In order to facilitate a "filling" of the vias 120 with the photosensitive material 130, the viscosity of this material, e.g., a photosensitive ink, can be easily adjusted by adapting a content of filler material as described above. With such a measure also the filling level of the vias 120 can be adjusted. In some embodiments, the filling level of different vias is different. This means that there are different via filling heights. Moreover, especially if a dispensing method is used (e.g., a method capable of locally applying the filling medium), different vias 120 can be filled with different filling materials.

In the embodiment depicted in the FIGS. 1A to 1D the curable material 130 is a positive photosensitive ink.

Figure 1B:
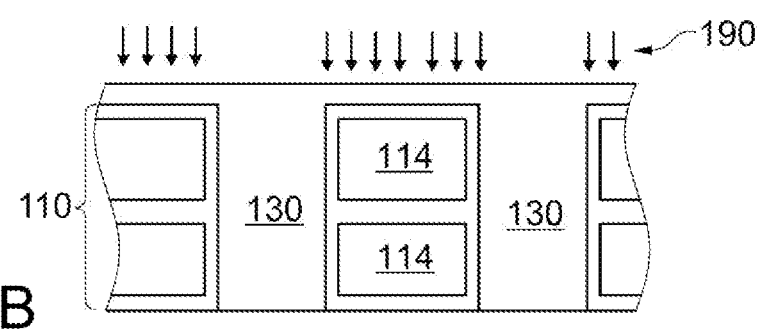

As can be taken from FIG. 1B showing the next step of the component carrier manufacturing method, the upper surface of the so far unhardened photosensitive material 130 is irradiated with electromagnetic radiation 190, for instance in the ultraviolet (UV) spectral range. The electromagnetic radiation 190 is a spatially structured radiation, which can be structured for instance by means of a not depicted mask. In this embodiment, the spatially structuring is accomplished such that solely surface portions outside from the vias 120 are irradiated. As a result of the irradiation, the irradiated curable material 130 is cured respectively hardened.

Figure 1C:
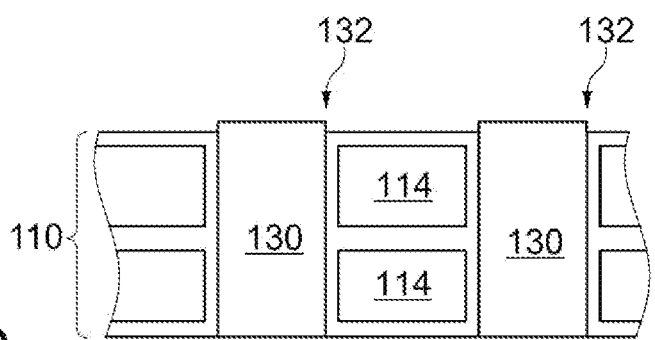

As can be taken from FIG. 1C showing the next step of the component carrier manufacturing method, the photosensitive material outside from the vias 120 is removed. According to the embodiment described here this is realized with a chemical etching procedure, which is a spatially not structured procedure. However, as mentioned above, the photosensitive material 130 is a positive photosensitive material 130. Hence, the not hardened photosensitive material 130 above (and within) the vias 120 is not removed. As a consequence, over each one of the vias 120 there remains a protrusion 132 of photosensitive material 130. These protrusions 132 extend over the upper main surface of the stack 110.

Figure 1D:
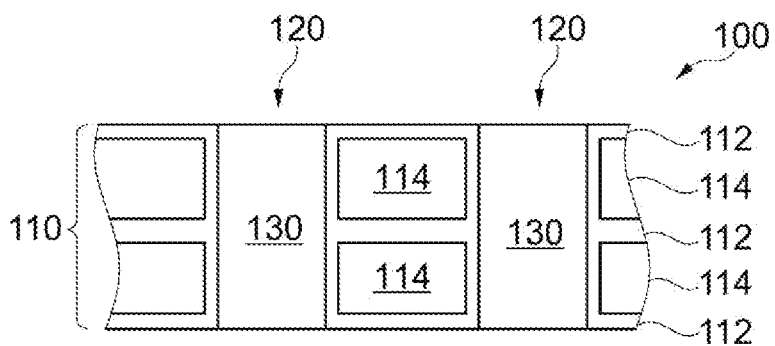
Figure 2A:
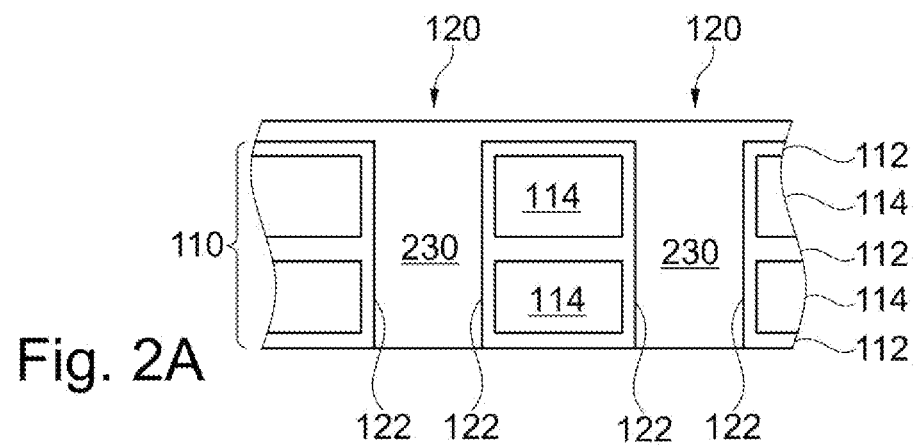
FIG. 2A, FIG. 2B, FIG. 2C, and FIG. 2D illustrate a process workflow wherein vias of a component carrier are plugged with a negative photosensitive ink.
Figure 2B:
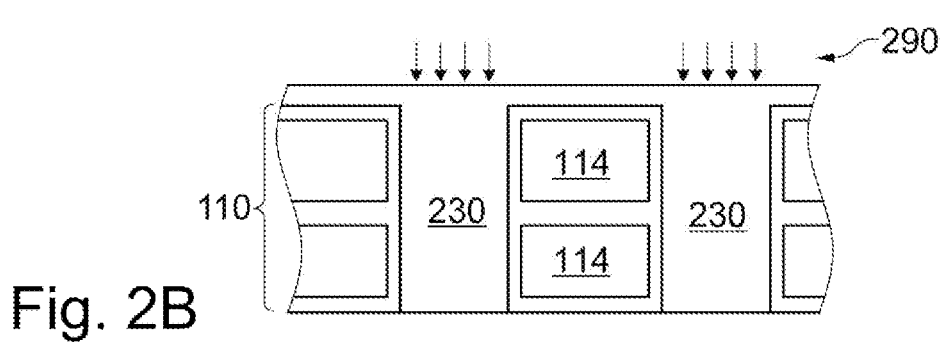
Figure 2C:
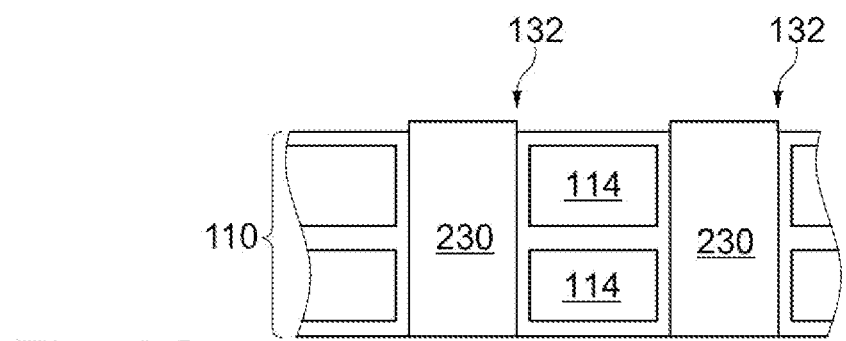
Figure 2D:
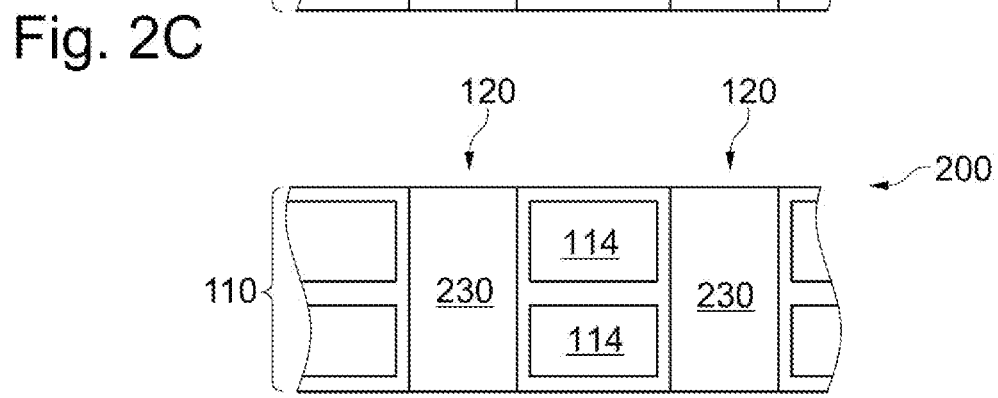

As can be taken from FIG. 1D showing the next step of the component carrier manufacturing method, the protrusions 132 are removed by means of a further etching procedure. According to the exemplary embodiment described here this further etching procedure is a plasma etching procedure. This may allow to selectively remove excess material above the opening.

It is pointed out that the described component carrier manufacturing method, wherein vias are plugged with a photosensitive/curable material 130, does not require any mechanic (post) processing of the main surface in order to end up with an evenness of the main surface which is suitable for further processing the component carrier 100 for instance by forming additional build up layers on top of or over the main surface. Even further, the planarization of the main surface by means of the plasma etching process may result in an evenness or reduced surface roughness of the main surface, which is much better (smoother) than non-mechanical planarization procedures such as a mechanical grinding.

It should be recognized that the process steps described above with reference to FIGS. 1A to 1D may be carried out together with other per se know process steps. A more complete description of the entire process, which may be carried out with a more or less liquid photosensitive ink, may include the following steps:

Surface treating of (the upper surface of) the stack;
Coating, e.g., a screen printing, of the stack with the photosensitive ink (see FIG. 1A));
Pre-baking the photosensitive ink;
Exposing the pre-baked ink with electromagnetic (UV) radiation (see FIG. 1B);
Developing "away" portions of the ink which have been "exposed" by the radiation (see FIG. 1C); (In case of a negative photosensitive ink (see FIGS. 2A-2D described below), the not exposed material is removed.)
Drying the remaining ink;
Performing a quality check, e.g., with an Automated Optical Inspection (AOI);
Etching away protruding ink material (see FIG. 1D);
Optionally: Depositing a thin metal layer, in particular copper, on top of the now planarized upper surface; (This can be realized for instance with electroless plating.)
Optionally: Adding further metal/copper on the deposited thin metal/copper layer; (Thereby, the previously deposited thin metal layer acts as a seed layer. This can be realized for instance with electroplating.)
Inducing a (further) hardening by means of a thermal/heat treatment.

FIGS. 2A to 2D illustrate a process workflow wherein the vias 120 of a component carrier 200 are plugged with a negative photosensitive ink 230. The process workflow with the negative photosensitive ink 230 widely corresponds to the workflow with the positive photosensitive ink 130 described above. Hence, for the sake of conciseness of this document same process steps are not elucidated again.

The only difference between the two workflows is that due to the negative photosensitive ink 230 (instead of the positive photosensitive ink 130) the employed electromagnetic radiation 290 must be spatially invers or spatially complementary to the electromagnetic radiation 190. This means that solely the regions of the vias 120 are irradiated.

Figure 3A:
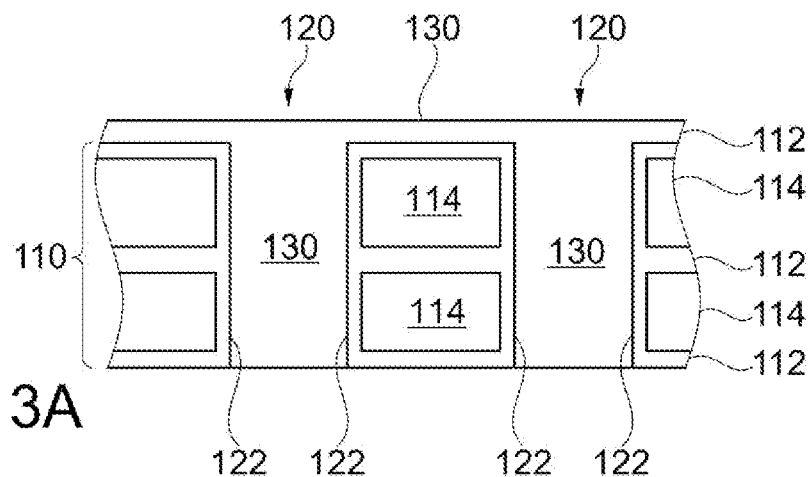
FIG. 3A, FIG. 3B, and FIG. 3C illustrate a process workflow wherein vias are plugged with a positive photosensitive ink being applied and cured at the entire main surface of a component carrier.
Figure 3B:
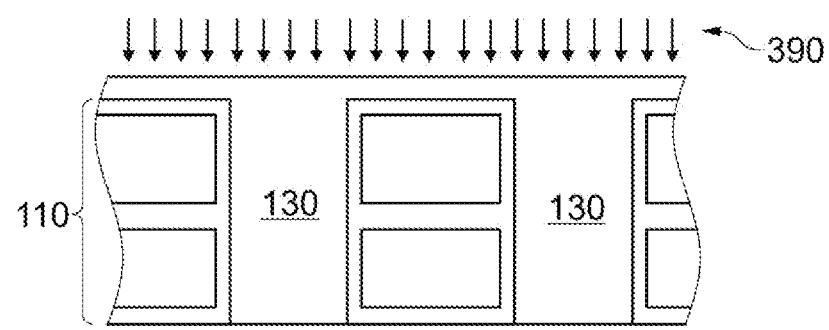
Figure 3C:
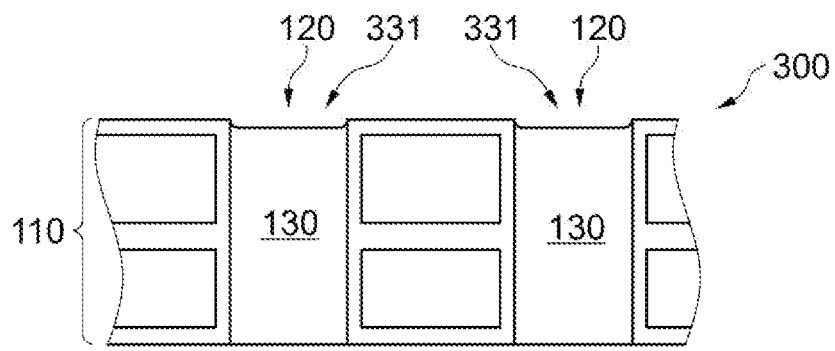

FIGS. 3A to 3C illustrate a process workflow wherein the vias 120 are plugged again with a photosensitive ink 130. The intermediate product shown in FIG. 3A is the same as the intermediate product for the first and second process workflow shown in FIG. 1A/2A. It is explicitly pointed out that the process workflow shown in FIGS. 3A to 3C can be realized both with a negative photosensitive material/ink and a positive photosensitive material/ink.

As can be taken from FIG. 3B, in this embodiment there is used an electromagnetic radiation 390 which is not spatially structured. This means that the entire main surface of the stack 110 is irradiated such that the photosensitive material 130 is hardened along the entire main surface of the stack 110. Thereby, also in this embodiment the irradiation is sufficiently strong that the photosensitive material 130 is hardened within the whole thickness. This holds true for the regions outside from the vias 120. With regard to the regions of the vias 120 the irradiation will of course not immediately stop at the depth level of the upper electrically conductive layer structure 112. There will be hardened also some material within the upper part of the interior of the vias 120. In some embodiments the hardening is not (only) caused by the (UV) electromagnetic radiation but (also) by a thermal treatment, e.g., a so-called soft baking process.

FIG. 3C shows the result of the next step of the workflow, which next step is again a wet or dry etching procedure. Due to the holohedral irradiation (and hardening) the hardened photosensitive material 130 is removed over the entire main surface of the stack 110 of the component carrier 300. Further, due to the irradiation penetrating partially into the upper part of the vias 120, the chemical etching removes some amount of the hardened photosensitive material 130. This results in a formation of dimples 331. However, these dimples 331 are small enough such that there is still a sufficient plugging of the vias 120 (with unhardened photosensitive material 130). With this etching procedure the surface of the filled via 130 will be additionally roughened (as the whole surface is exposed). This may facilitate a subsequent metallization of the upper surface.

Due to the complete removal of the hardened photosensitive material in the regions over the vias 120 there is no need for a further etching procedure. The roughness of the main surface of the stack 110 will be on the one hand sufficiently large for the above-described subsequent metallization and on the other hand sufficiently small and in particular smaller than a surface roughness achievable with a mechanical grinding such that a high-quality further processing of the component carrier can be carried out.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

LIST OF REFERENCE SIGNS 100 component carrier
110 stack
112 electrically conductive layer structure
114 electrically insulating layer structure
120 opening/via
122 sidewall
130 fill material/positive photosensitive ink
132 protrusions
190 (structured) electromagnetic radiation
200 component carrier
230 fill material/negative photosensitive ink
290 (structured) electromagnetic radiation
300 component carrier
331 dimple
390 uniform electromagnetic radiation

The invention claimed is:

1. A component carrier, comprising:
a stack comprising at least one electrically conductive layer structure and at least one electrically insulating layer structure;
an opening located at least partially in the stack; and
a fill material which is located within the opening, wherein the fill material is a photosensitive material, wherein at least a part of the photosensitive material has undergone a hardening treatment with electromagnetic radiation such that a dimple is formed in the fill material with respect to a main surface of the stack; where surface portions of the main surface of the stack outside of the opening are free from the hardened photosensitive material.

2. The component carrier as set forth in claim 1, wherein the fill material comprises ink.

3. The component carrier as set forth in claim 1, wherein the fill material comprises resin.

4. The component carrier as set forth in claim 1, wherein the fill material comprises functional particles.

5. The component carrier as set forth in claim 1, wherein the fill material comprises a first Coefficient of Thermal Expansion, CTE, being smaller than a second CTE of the electrically insulating layer structure.

6. The component carrier as set forth in claim 1, wherein a CTE difference between the first CTE and the second CTE is larger than 2 ppm/K.

7. The component carrier as set forth in claim 1, further comprising:
at least one further opening, which, together with the opening, defines a plurality of openings; and
a further fill material;
wherein at least one opening of the plurality of openings is filled with the further fill material.

8. The component carrier as set forth in claim 1, wherein the fill material is optically transparent.

9. The component carrier as set forth in claim 1, wherein the opening comprises sidewalls which are coated at least partially with an electrically conductive material.

10. The component carrier as set forth in claim 1, wherein the opening is a through hole via or a blind hole via.

11. The component carrier as set forth in claim 1, wherein a first portion of the via is filled with the fill material and a second portion of the via is an open portion.

12. The component carrier as set forth in claim 2, wherein deposition of ink is supported by negative pressure.

13. The component carrier as set forth in claim 1, wherein the electrically conductive layer structure comprises a smooth surface roughness and/or a thickness variation of less than 10 μm.

14. A method for manufacturing a component carrier, the method comprising:
providing a stack comprising at least one electrically conductive layer structure and at least one electrically insulating layer structure;
forming at least one opening located at least partially in the stack;
applying a photosensitive material at a main surface of the stack such that the opening is filled at least partially with the photosensitive material;
treating at least some regions of the applied photosensitive material such that the photosensitive material is hardened forming a dimple in the fill material with respect to a main surface of the stack; and
removing excessive hardened material such that surface portions of the main surface of the stack outside from the at least one opening are free from hardened material.

15. The method as set forth in claim 14, wherein removing excessive hardened material comprises an etching procedure, in particular a chemical etching procedure and/or a plasma etching procedure.

16. The method as set forth in claim 14, wherein treating at least some regions of the applied photosensitive material comprises treating selectively predefined regions of the applied photosensitive material such that some regions of the applied photosensitive material become hardened regions and other regions of the applied curable material remain unhardened regions.

17. The method as set forth in claim 14, wherein the photosensitive material is applied by means of a screen-printing process and/or an ink jet printing process.

18. The method as set forth in claim 14, wherein the photosensitive material is a positive photosensitive material or a negative photosensitive material.

19. The method as set forth in claim 14, further comprising:
after removing excessive hardened material,
performing a plasma treatment procedure.

20. The method as set forth in claim 14, wherein applying the photosensitive material at the main surface is carried out in such a manner that further
a metal layer defining the main surface is coated with the photosensitive material and wherein
treating at least some regions of the applied photosensitive material with a non-mechanical smoothing process.

* * * * *